United States Patent [19]
Hoppe et al.

[11] Patent Number: 5,946,198
[45] Date of Patent: Aug. 31, 1999

[54] CONTACTLESS ELECTRONIC MODULE WITH SELF-SUPPORTING METAL COIL

[75] Inventors: Joachim Hoppe; Arno Hohmann, both of Munich, Germany

[73] Assignee: Giesecke & Devrient GmbH, Munich, Germany

[21] Appl. No.: 08/546,990

[22] Filed: Oct. 23, 1995

[30] Foreign Application Priority Data

Oct. 21, 1994 [DE] Germany ................ 44 37 721

[51] Int. Cl.$^6$ .................. H05K 1/16; H01L 23/495
[52] U.S. Cl. .................. 361/813; 257/531; 257/924; 257/676; 361/820; 361/737
[58] Field of Search .................. 174/52.1, 52.2, 174/52.3, 260, 261, 268; 156/625, 53; 257/531, 679, 676, 684, 723, 724, 904, 924, 666; 361/728, 737, 807, 809, 813, 820, 782, 811, 821; 343/702, 700 MS, 872; 235/487, 488, 449, 492; 336/198, 200, 208, 221; 340/573, 825

[56] References Cited

U.S. PATENT DOCUMENTS

| | | |
|---|---|---|
| 4,999,742 | 3/1991 | Stampfli . |
| 5,095,357 | 3/1992 | Andoh et al. .................. 257/531 |
| 5,399,847 | 3/1995 | Droz .................. 361/737 |
| 5,420,757 | 5/1995 | Eberhardt et al. .................. 361/813 |
| 5,428,245 | 6/1995 | Lin et al. .................. 257/666 |
| 5,521,431 | 5/1996 | Tahara .................. 257/676 |
| 5,569,879 | 10/1996 | Gloton et al. .................. 361/728 |
| 5,572,410 | 11/1996 | Gustafson .................. 361/807 |
| 5,606,488 | 2/1997 | Gustafson .................. 361/737 |
| 5,642,276 | 6/1997 | Lotti et al. .................. 361/813 |
| 5,786,626 | 7/1998 | Brady et al. .................. 257/666 |
| 5,793,096 | 8/1998 | Yu et al. .................. 257/531 |

FOREIGN PATENT DOCUMENTS

| | | |
|---|---|---|
| 4311493 | 10/1994 | Germany . |
| 4431605 | 3/1996 | Germany . |
| 59-190717 | 10/1984 | Japan . |
| 93/20537A1 | 10/1993 | WIPO . |

*Primary Examiner*—Donald Sparks
*Attorney, Agent, or Firm*—Stevens, Davis, Miller & Mosher, L.L.P.

[57] ABSTRACT

An electronic module to be installed in a data carrier is described, the electronic module having an integrated circuit disposed on a carrier of the module and connected electrically with a coil for noncontacting data exchange. To make such electronic modules easy to produce and more cost-effective, the inventive module dispenses completely with an additional separate substrate for receiving the integrated circuit and coil.

21 Claims, 7 Drawing Sheets ated circuit and coil. Furthermore it is easy to adapt the module to different sizes of the integrated circuit since the integrated circuit need not be housed in a previously defined gap in a separate carrier substrate. The integrated circuit can instead be disposed anywhere on the module. This allows the integrated circuit to be placed in optimal fashion, for example in an area where the least mechanical stresses occur in the data carrier.

CONTACTLESS ELECTRONIC MODULE WITH SELF-SUPPORTING METAL COIL

FIELD OF INVENTION

This invention relates to an electronic module to be installed in a data carrier having an integrated circuit disposed on a carrier of the module, said circuit being connected electrically with a coil for noncontacting data exchange of the data carrier with an external device. The invention relates further to a data carrier having a corresponding electronic module.

BACKGROUND OF THE INVENTION

Data carriers with installed electronic modules are already well-known and used as credit cards, bank cards, cash payment cards and such in a great variety of service sectors, for example cashless money transfer or in the in-house area for access entitlement. With a majority of these data carriers the power is supplied to the electronic module and/or data exchange with external devices in contacting fashion via outer contact surfaces. Since the contact surfaces of the module are exposed in these data carriers they can get dirty, which may lead to poor contacting and thus faulty data transmission between the data carrier and the external device. Furthermore, faulty data transmission can also occur due to faulty positioning of the data carrier and thus of the contact. surfaces in the external device. Finally, data exchange cannot take place between the data carrier and the external device over a relatively great distance, as is desired for some applications. Electronic modules for noncontacting data exchange are therefore also used in data carriers.

EP 376 062, for example, describes such an electronic module with inductive coupling wherein a coil and an integrated circuit are glued to a substrate. The integrated circuit is located in the interior of the coil and is connected electrically thereto by bonding wires. The remaining interior of the coil is filled with a casting compound to protect the sensitive components of the module from mechanical loads, the coil being used as a limiting frame for the casting compound.

Another electronic module with inductive coupling is shown in Wo 93/20537. Here a wound coil is used whose size corresponds substantially to the outside dimensions of the card body. In a flattened corner of the coil a substrate is fixed to the coil by a hot-melt adhesive. The coil ends are glued over a gap in the substrate. The integrated circuit is inserted in the gap in the substrate and connected electrically with the coil ends extending over the gap.

The stated prior art thus requires a separate additional carrier substrate on which the integrated circuit and coil are disposed.

SUMMARY OF THE INVENTION

The problem of the present invention is to propose, on this basis, an. easily produced and cost-effective electronic module for contactless coupling and a data carrier having a corresponding module.

The basic idea of the inventive solution is to dispense completely with an additional separate substrate for receiving integrated circuit and coil in the production of the electronic module, the integrated circuit being nevertheless carried by the module.

An advantage of the present invention is that one obtains a stable and easily produced electronic module without using an additional separate carrier substrate for integrated According to a first embodiment the integrated circuit is fixed with an adhesive, e.g. a hot-melt adhesive or liquid adhesive, to a wound coil whose wires are surrounded by an insulating lacquer, and is electrically connected with the ends of the coil. The coil is self-supporting and needs no separate additional carrier substrate. Alternatively one can omit the fixation with an adhesive, so that the integrated circuit is held only by the coil ends. The coil itself constitutes the carrier for the integrated circuit. The coil ends can be connected with the connection points of the integrated circuit either directly or via a conductive bridge. If only few turns are required, the coil can also be of singlelayer design and be connected with the integrated circuit in such a way that the coil wire is not crossed. The coil can be cast with a casting compound in the area of the integrated circuit. In a development, the integrated circuit can also be disposed in the plane of the coil, so that the coil laterally encloses the integrated circuit or the integrated circuit is mounted laterally beside the coil.

In further embodiments, one or more coils are punched out of a self-supporting metal band. The term "self-supporting metal band" means in this context that the metal band is not connected with any further substrate carrying it. The integrated circuit is electrically connected with the coil ends either via additional electroconductive bonding wires, e.g. by the wire bonding or TAB technique, or directly. In any case the integrated circuit is carried by the metal band. This is possible, on the one hand, if the integrated circuit is carried directly by the coil. In this case the integrated circuit can either be located partly on the coil and be connected with the coil ends via additional electroconductive elements, or it is electrically connected with the coil ends directly, whereby it can preferably be carried by them. On the other hand, if the coil is produced from a metal band the integrated circuit can be disposed in a specially provided area of the metal band which is either part of the coil or located outside the coil. The integrated circuit as well as the conductive connections between coil and integrated circuit can again optionally be cast with a casting compound.

The described modules are preferably installed in a data carrier by the laminating technique. Several card layers are thereby interconnected by the action of heat and pressure. The core layers of the structure contain gaps suitable for receiving the electronic module. Other techniques well-known to the expert can of course also be applied for embedding the electronic module, such as injection molding or cold casting.

Embodiments and further advantages of the invention can be found in the subclaims as well as the drawings, in which:

DESCRIPTION OF THE PREFERRED EMBODIMENT

Figure 1:
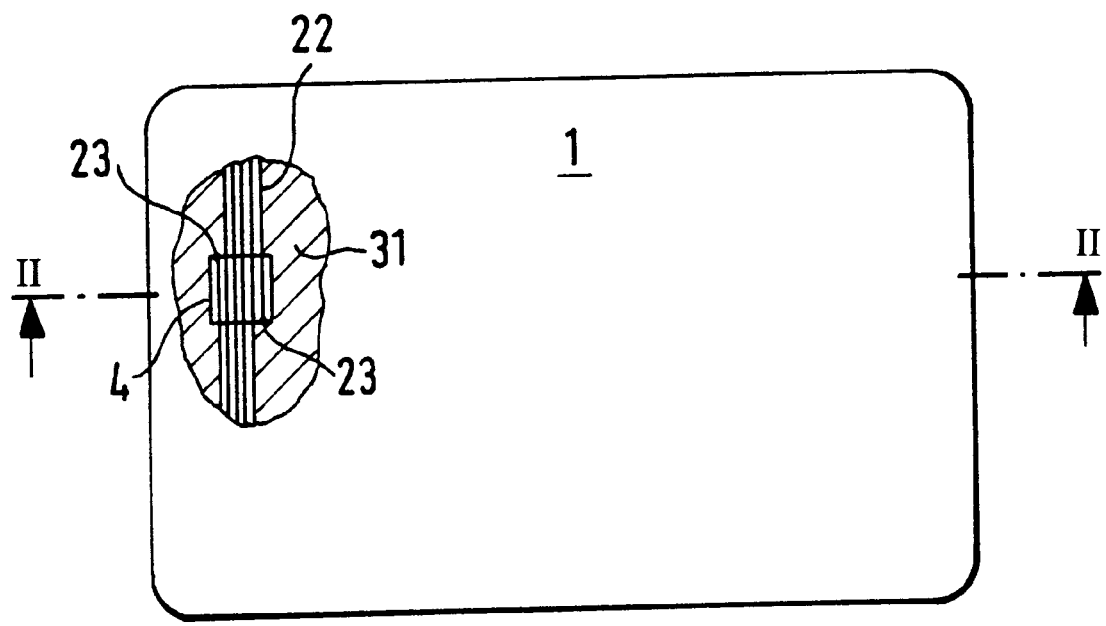
FIG. 1 shows a front view of a data carrier with a first embodiment of an electronic module with a wire-wrapped coil and integrated circuit.

FIG. 1 shows a front view of data carrier 1, e.g. a chip card, with embedded, contactless electronic module 31. In this first embodiment electronic module 31 includes integrated circuit 4 and wire-wrapped coil 22, integrated circuit 4 lying directly on wound coil 22. Alternatively, integrated circuit 4 can additionally be glued to coil 22 by a hot-melt adhesive or liquid adhesive. The wire of wound coil 22 is enveloped with an insulating lacquer to prevent a short-circuit between the coil wires. The ends of the coil are connected electrically with the connection points of integrated circuit 4. Coil 22 is cast with casting compound 6 in the area of integrated circuit 4, as to be seen in FIG. 2.

Figure 2:
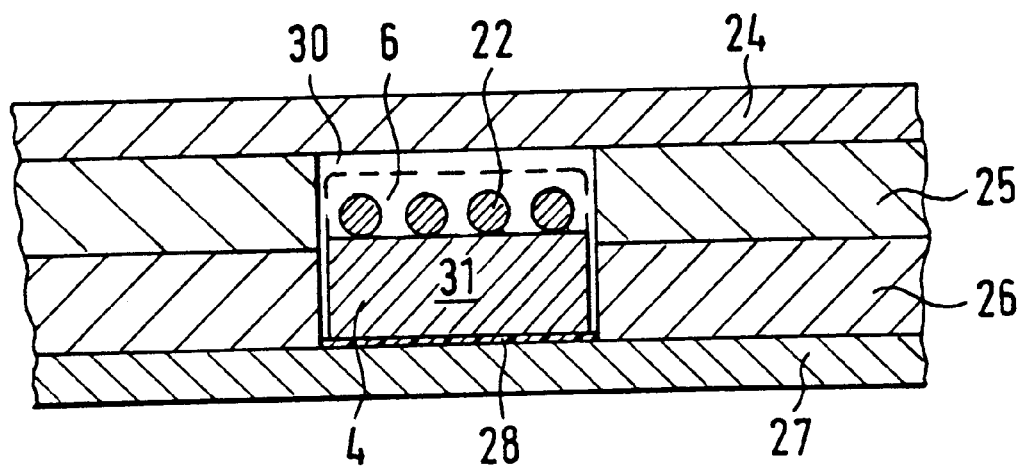
FIG. 2 shows a sectional view of the data carrier with a module from FIG. 1.

FIG. 2 shows a section of the data carrier according to FIG. 1 along line II—II. Cast 6 can be produced by a mold consisting of two halves which form a closed space when joined. The casting mold is designed so that one half has a gap for receiving integrated circuit 4, and mounting the second half gives rise to the closed space which has an opening for guiding through wound coil 22. Casting takes place by injecting a casting compound into the closed mold and removing the mold after the compound has hardened. The mold can be made of metal or plastic, for example, and be provided before casting with a parting agent to prevent the compound from adhering to the mold. If a parting agent should be omitted the mold can also be made of silicone.

As can also be seen from FIG. 2, electronic module 31 is located in specially provided gap 30 in card layers 25, 26. Integrated circuit 4 is fastened to layer 27 by adhesive 28. Card layers 24, 25, 26, 27 are interconnected by hot-melt adhesive or liquid adhesive.

Figure 3:
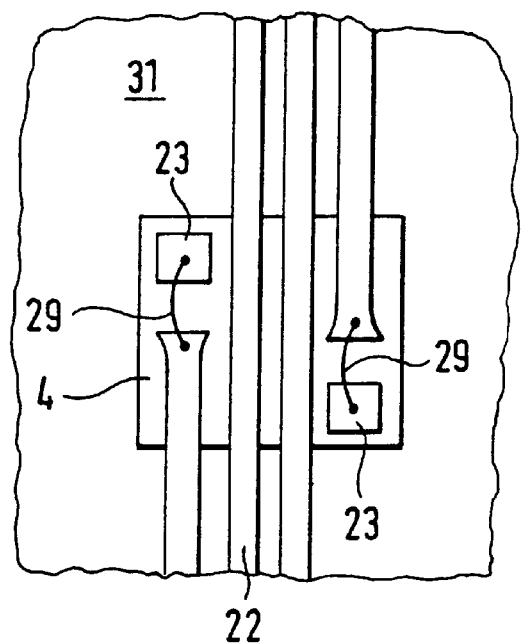
FIG. 3 shows a detail of the connection between the coil end and the connection points of the integrated circuit of the module from FIG. 2.

FIG. 3 shows the connection between the coil end and the connection points of integrated circuit 4. The ends of coil 22 are connected electrically with connection points 23 of integrated circuit 4 via bonding wires 29. To increase the contacting surfaces of the coil ends, the latter are flattened at the ends. In an embodiment not shown, the coil ends can also be connected with the connection points of integrated circuit 4 via conductors, whereby the conductors can be applied by the TAB technique (tape automated bonding) known to the expert.

Figure 4:
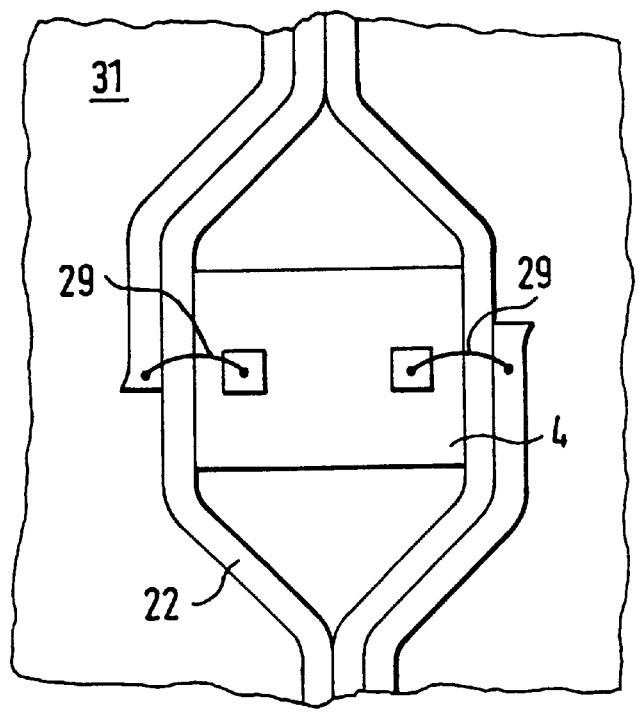
FIG. 4 shows a development of the electronic module from FIGS. 1 to 3 with the integrated circuit disposed laterally of the coil.

FIG. 4 shows a development of electronic module 31 from FIGS. 1 to 3. Integrated circuit 4 is disposed in a plane with coil 22. This has the particular advantage that a very thin design can be obtained. Integrated circuit 4 can naturally also be connected directly with the ends of coil 22. Cast 6 could be produced in the way described above. The two mold halves should be designed so that the closed mold encloses both integrated circuit 4 and coil 22 in the area of integrated circuit 4, the mold having openings for guiding through coil 22.

Figure 5:
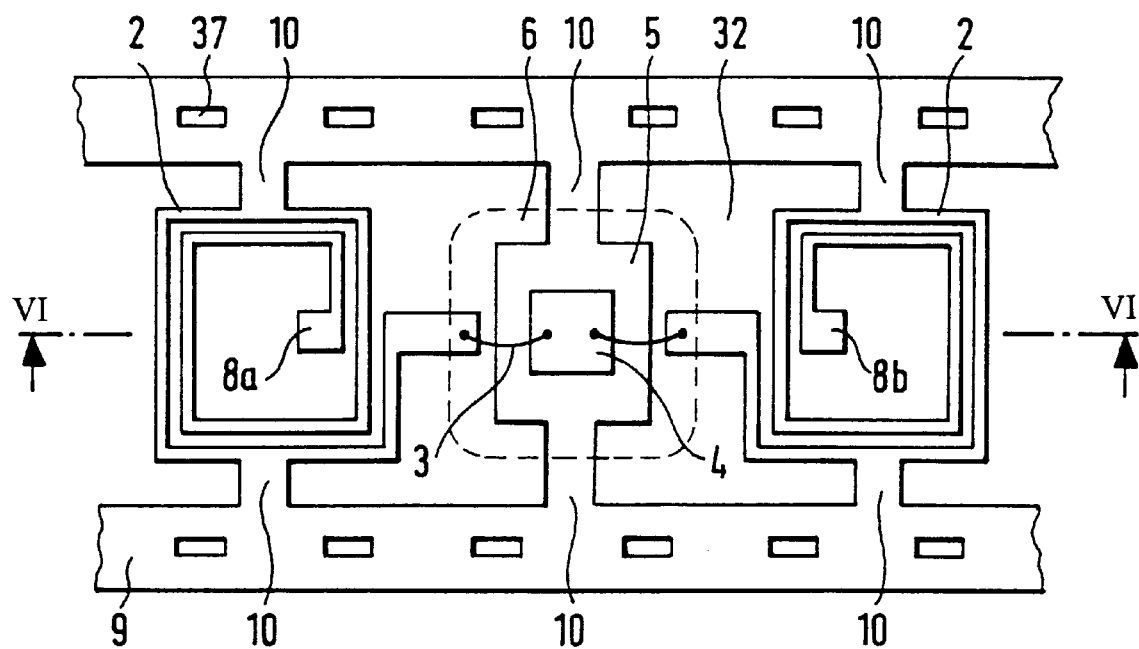
FIG. 5 shows a second embodiment of a punched electronic module, the coil being obtained from a self-supporting metal band.

FIG. 5 shows a second embodiment example of inventive module 32. Here coil 2 is produced from self-supporting metal band 9, e.g. by punching in such a way that coil 2 is still connected with self-supporting metal band 9 via bars 10. For exact positioning of metal band 9 the latter has additional positioning holes 37. Integrated circuit 4 can be disposed e.g. on coil-less central area 5 of the metal band, being electrically connected with the ends of coil 2 via bonding wires 3. Bonding wires 3, the coil ends, integrated circuit 4 as well as central area 5 of metal band 9 can be cast with casting compound 6 into a cast block. Such a cast 6 can be produced for example by placing on each side of metal band 9 a mold half which forms a closed space with the opposite mold half, whereby the mold halves have openings in the closed state for bars 10 and the ends of coils 2. Casting is performed in the same way as in the first embodiment. The mold halves are also made of the same materials.

Figure 6:
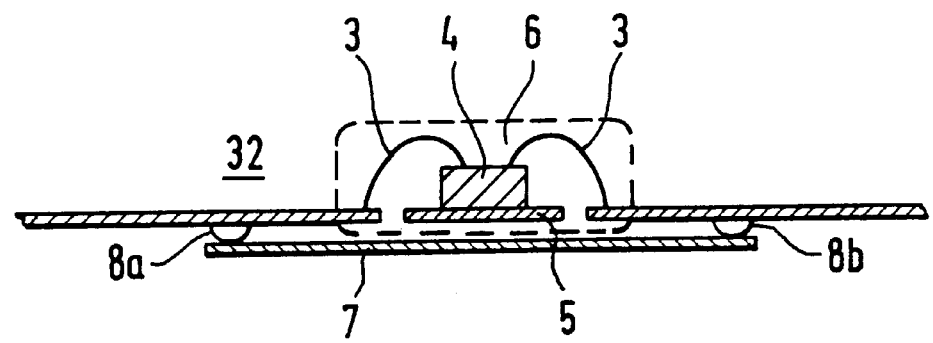
FIG. 6 shows a section of the electronic module according to FIG. 5.

To complete module 32, connecting bars 10 are severed and the two inner ends 8 of coils 2 electrically interconnected, as to be seen in FIG. 6.

FIG. 6 shows a section of module 32 from FIG. 5 along line VI—VI. The two inner ends 8a, 8b of the coils are electrically interconnected via contact bridge 7. Contact bridge 7 can be electrically insulated between the two connection points 8a, 8b to avoid short-circuits.

Figure 7:
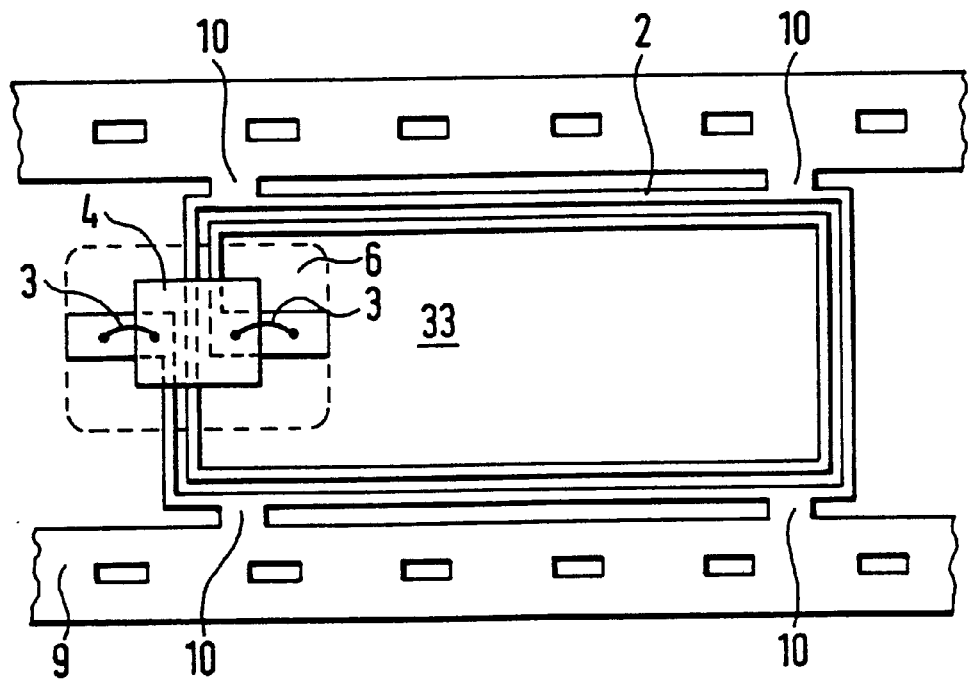
FIG. 7 shows a third embodiment of a punched electronic module.

FIG. 7 shows a third embodiment of punched, contactless electronic module 33. As in FIG. 5, coil 2 is punched out of self-supporting metal band 9 but, in contrast with FIG. 5, integrated circuit 4 is disposed directly on coil 2 at least partly and electrically connected with the ends of coil 2 via bonding wires 3.

Figure 8:
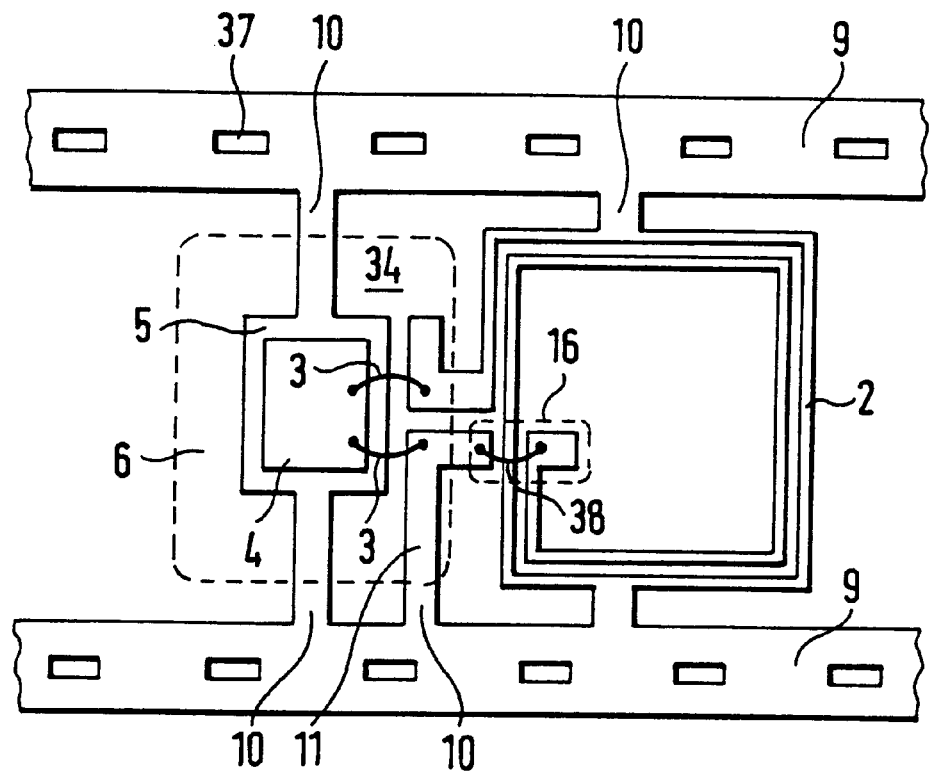
FIG. 8 shows a fourth embodiment of a punched electronic module.

FIG. 8 shows a fourth embodiment of punched, contactless electronic module 34 which has only one coil. It is produced analogously to the one described in FIG. 5. To prevent the conductive connection between integrated circuit 4 and the inner end of coil 2 from becoming too long, contact bridge 11 is additionally provided. This bridge is connected electrically via bonding wires 3, 38 both with integrated circuit 4 and with the inner end of coil 2. In the area of bonding wire 38 coil 2 and contact bridge 11 are provided with insulating lacquer 16.

Figure 9:
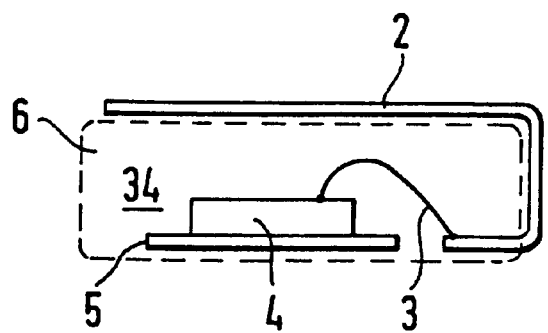
FIG. 9 shows the electronic module according to FIG. 8 in a sectional view, the coil being bent over the cast block.

FIG. 9 shows an advantageous development of electronic module 34 from FIG. 8, wherein coil 2 is bent on the cast block of casting compound 6 in such a way that coil 2 is located on the cast block of casting compound 6, as shown here. One thus obtains electronic module 34 with a compact structure.

Figure 10:
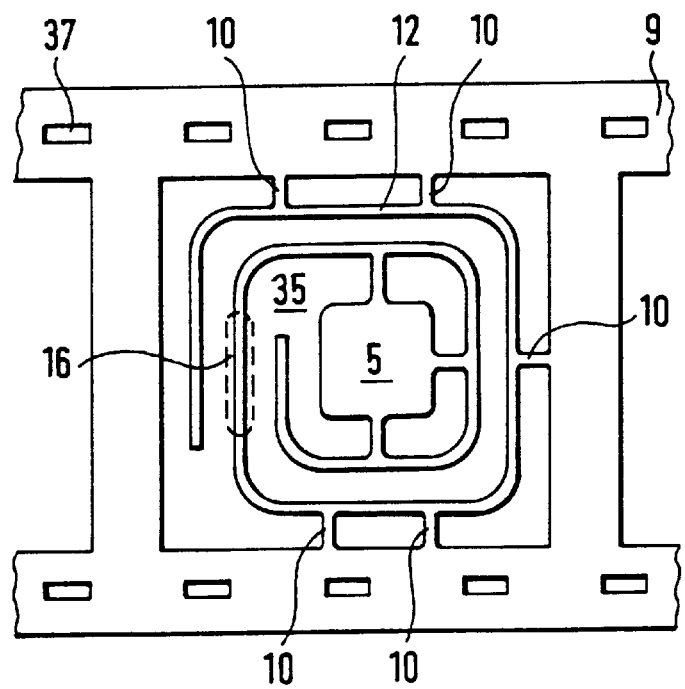

FIG. 10 shows the punching of a coil out of a self-supporting metal band, being suitable for a fifth embodiment of contactless electronic module 35.

Figure 11:
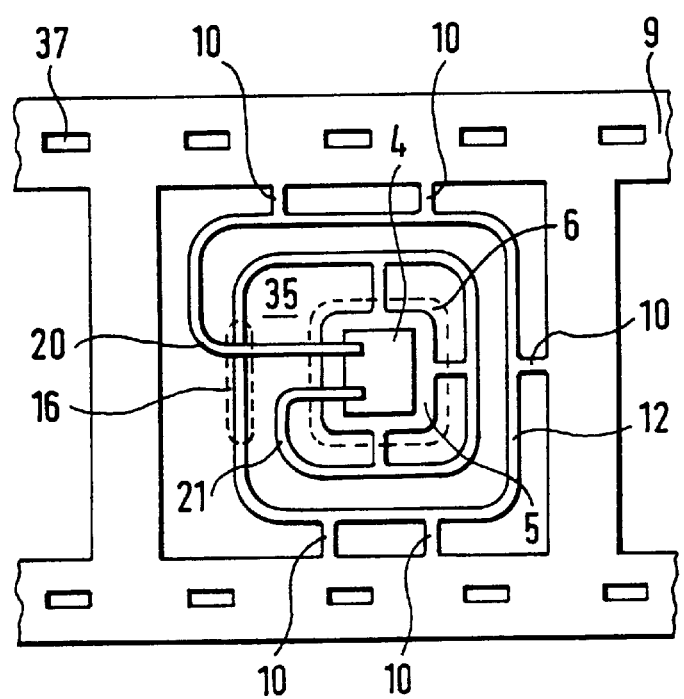

FIG. 11 shows finished electronic module 35 with the coil prefabricated as in FIG. 10. The module is produced substantially like the one from FIG. 5. Integrated circuit 4 is disposed on area 5 of the metal band which also serves as a carrier of integrated circuit 4. Deviating from FIG. 5, the conductive connection between integrated circuit 4 and coil 12 is not realized via bonding wires, but the coil ends are electrically connected with integrated circuit 4 directly. For this purpose coil ends 20 and 21 are bent accordingly. In the area where coil end 20 is located on turns 20 of the coil, insulating lacquer 16 is applied to prevent a shortcircuit of the coil.

Figure 12:
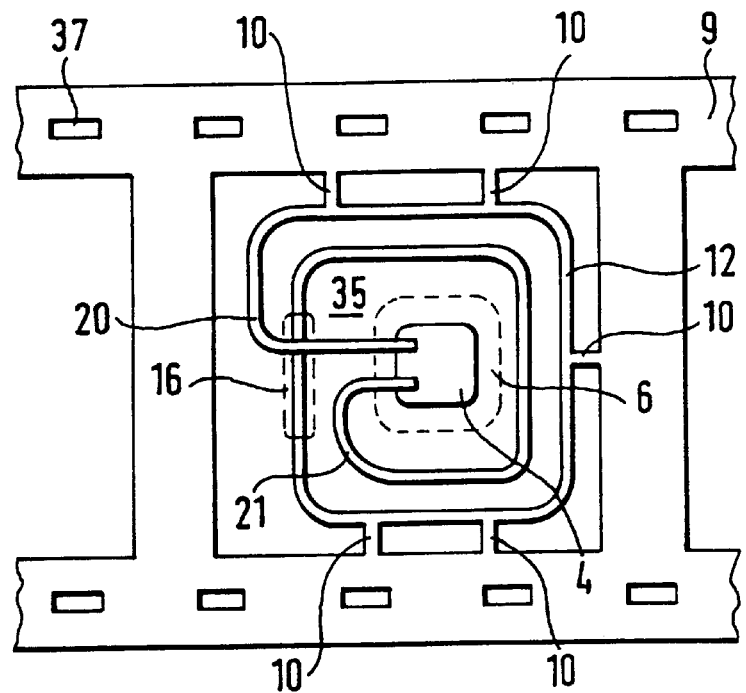
FIGS. 10 to 12 show a fifth embodiment of a contactless electronic module.

FIG. 12 shows a development of the embodiment according to FIG. 11. Area 5 of the metal band can also be omitted here, integrated circuit 4 then being carried by coil ends 20, 21.

Figure 13:
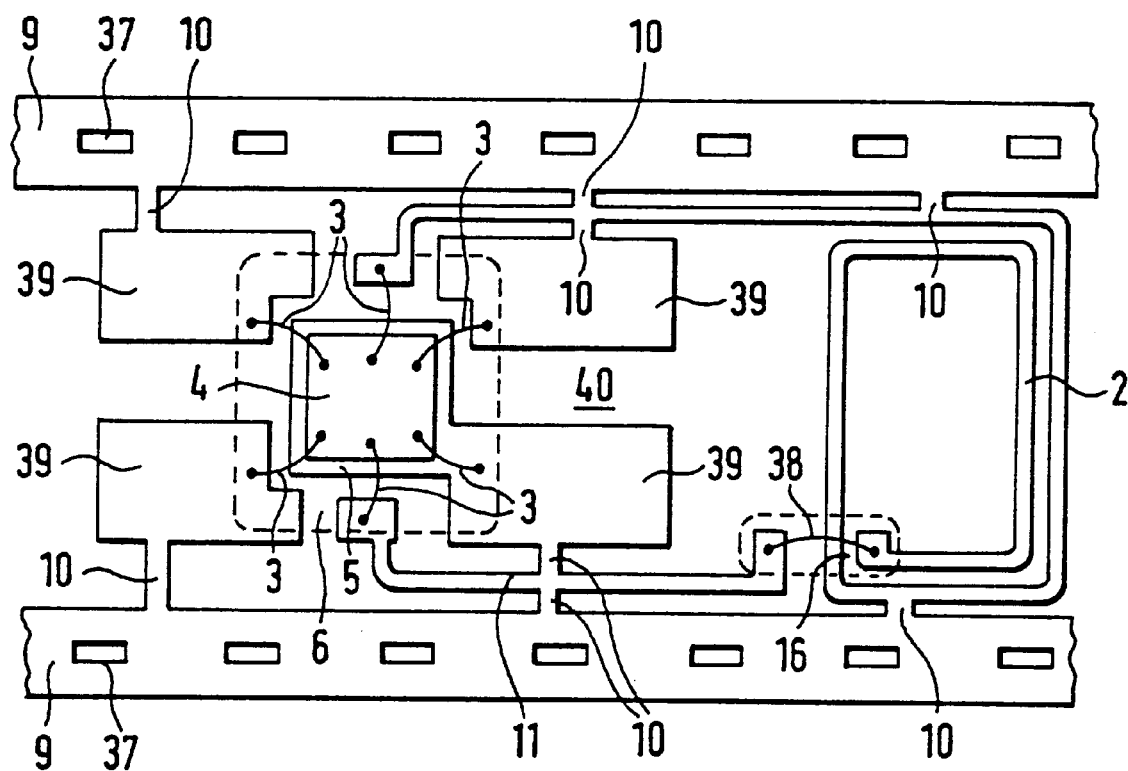
FIG. 13 shows a sixth embodiment of a contactless electronic module with additional contact surfaces.

FIG. 13 shows a sixth embodiment of punched, contactless electronic module 40. This module is provided not only with coil 2 but also with contact surfaces 39 for contacting coupling of integrated circuit 4 with external devices, so that integrated circuit 4 can communicate both with contacting-type and with noncontacting-type external devices.

This electronic module is manufactured like the electronic modules according to FIGS. 5, 7, 8, 10 and 12 and completed by severing bars 10. Contact surfaces 39 shown can of course also be provided in the modules according to FIGS. 5, 7, 8, 10 and 12.

Finally it should be noted that the invention is not restricted to the embodiments shown. For examples the casting compound in the embodiments shown can be left out, or the conductive connections between integrated circuit and coil ends can be produced by a different technique familiar to the expert. The electronic modules described with reference to the various embodiments can also be embedded by a technique other than that shown in FIGS. 1 and 2, for example by injection molding or cold casting, which are familiar to the expert. The card body is of course then produced, not by the laminating technique shown, but by injection molding or cold casting, whereby the card body can then also consist of one layer.

We claim:

1. An electronic module (31) to be installed in a data carrier (1) having an integrated circuit (4) disposed on a carrier of the module, said circuit being connected electrically with a coil (22) for noncontacting data exchange of the data carrier (1) with an external device, characterized in that the coil (22) is wire-wrapped, has a cross section of predetermined thickness and width and is self-supporting, and the coil (22) constitutes the carrier for the integrated circuit (4).

2. The electronic module of claim 1, characterized in that the coil ends are connected with the integrated circuit (4) in such a way that the coil wire is not crossed.

3. The electronic module of claim 1, characterized in that the integrated circuit (4) is in a plane with the coil (22).

4. The electronic module of claim 1 characterized in that the integrated circuit (4) is glued to the coil (22).

5. The electronic module of claim 1 characterized in that the coil (22) is cast with a casting compound (6) in the area of the integrated circuit (4).

6. The electronic module of claim 1 characterized in that the coil ends are electrically connected with the connection points (23) of the integrated circuit (4) directly.

7. The electronic module of claim 1 characterized in that the coil ends are connected with the connection points (23) of the integrated circuit (4) by means of additional electroconductive elements (29).

8. An electronic module comprising a carrier and an integrated circuit disposed on the carrier of the module, said circuit being connected electronically with a coil for non-contacting data exchange with an external device, characterized in that the coil is produced from a self-supporting metal band and the carrier is made of a material of the metal band.

9. The electronic module of claim 8, characterized in that the integrated circuit is disposed at least partly on the coil.

10. The electronic module of claim 9, characterized in that the coil comprises coil ends and in that the integrated circuit is carried by the coil ends.

11. The electronic module of claim 8, characterized in that the integrated circuit (4) is disposed in the area of the carrier which is not occupied by the coil.

12. The electronic module of claim 11, characterized in that two coils (2) are provided, one end of each-coil being electrically connected with the integrated circuit (4) and the other ends of the coils being interconnected by means of an electroconductive bridge (7).

13. The electronic module of claim 8, characterized in that the coil comprises coil ends and in that the electronic module further comprises additional electroconductive elements for connecting the integrated circuit with the coil ends.

14. The electronic module of claim 8, characterized in that the coil comprises coil ends and in that the integrated circuit is electrically connected with the coil ends directly.

15. The electronic module of claim 8, further comprising a casting compound for surrounding the integrated circuit.

16. The electronic module of claim 15, characterized in that a portion of the coil which protrudes beyond the casting compound is bent so as to be located on the casting compound.

17. The electronic module of claim 15, characterized in that the integrated circuit is connected to the coil through electroconductive connections and in that the casting compound also surrounds the electroconductive connections.

18. The electronic module of claim 17, characterized in that a portion of the coil which protrudes beyond the casting compound is bent so as to be located on the casting compound.

19. The electronic module of claim 8, characterized in that not only the coil but also contact surfaces (39) are provided via which the integrated circuit can communicate with external devices in contacting fashion.

20. The combination of a data carrier and an electronic module (31) contained therein, said electronic module comprising an integrated circuit (4) disposed on a carrier of the module, said circuit being connected electrically with a coil (22) for non-contacting data exchange of the data carrier (1) with an external device, characterized in that the coil (22) is wire-wrapped, has a cross section of predetermined thickness and width and is selfsupporting and the coil (22) constitutes the carrier for the integrated circuit (4).

21. The combination of a data carrier with an electronic module, said electronic module comprising a carrier and an integrated circuit disposed on the carrier of the module, said circuit being connected electronically with a coil for non-contacting data exchange between the data carrier and an external device, said combination being characterized in that the coil is produced from a self-supporting metal band and that the the carrier of the module is made of a material of the metal band.

* * * * *